United States Patent [19]

Salzer et al.

[11] 4,388,512
[45] Jun. 14, 1983

[54] ALUMINUM WIRE BALL BONDING APPARATUS AND METHOD

[75] Inventors: Thomas E. Salzer, Bedford, Mass.; John R. Saxelby, Jr., Dallas, Tex.

[73] Assignee: Raytheon Company, Lexington, Mass.

[21] Appl. No.: 242,073

[22] Filed: Mar. 9, 1981

[51] Int. Cl.³ .............................................. B23K 9/06
[52] U.S. Cl. ................................. 219/56.22; 219/56.1; 219/137 PS; 219/130.4
[58] Field of Search ................... 219/56, 56.1, 56.21, 219/56.22, 137 PS, 130.4

[56] References Cited

U.S. PATENT DOCUMENTS 2,759,088  8/1956  Lincoln ........................ 219/137 PS
3,241,218  3/1966  Phillips ........................... 219/130.4
4,123,646  10/1978  Keinanen ........................ 219/130.4
4,323,759  4/1982  Edson et al. .................... 219/56.22

FOREIGN PATENT DOCUMENTS 1536872  12/1978  United Kingdom .

Primary Examiner—C. C. Shaw
Attorney, Agent, or Firm—William R. Clark; Joseph D. Pannone

[57] ABSTRACT

A method and apparatus for forming a spherical shape on the end of an aluminum wire using a relatively low voltage across an arc gap to heat the end. Because the voltage is below the minimum sparking potential, a high voltage impulse is superimposed on the electrode to ionize the gas therebetween and initiate the arc. The gap may be in a protective environment such as an inert gas to prevent the formation of additional oxide. The wire may then be used in an aluminum ball bond.

22 Claims, 9 Drawing Figures

ALUMINUM WIRE BALL BONDING APPARATUS AND METHOD

The Government has rights in this invention pursuant to Contract Number N00030-80-C0019 awarded by Department of Navy.

BACKGROUND OF THE INVENTION

In the field of electronics, there are many applications for electrically connecting a small diameter wire to a substantially planar surface. For example, one such application is the use of a wire to electrically interconnect a terminal pad of a microelectronic device such as an integrated circuit silicon chip to a conductor or substrate circuit of a package on which the chip is mounted.

Two common techniques of electrically connecting a wire to a substantially planar surface are wedge bonding and ball bonding. In wedge bonding, a wedge shaped ultrasonic tool is used to connect the outer cylindrical surface of the wire to the planar surface. Accordingly, the take-off angle of the wire from the planar surface is not perpendicular to the surface. In ball bonding, a spherical shape or ball is formed at the end of the wire and then the ball is bonded to the planar surface by a well-known method such as thermocompression or ultrasonic bonding. Generally, before bonding, the wire having a spherical shape or ball on the end is positioned in the capillary of a ball bonding tool which is then moved until the ball contacts the planar surface. After the bond is made, the wire take-off angle is perpendicular to the planar surface.

Ball bonding has advantages over wedge bonding. For example, because the take-off angle of the ball bond wire is perpendicular to the planar surface, the area of the bond itself is smaller than with a wedge bond. Furthermore, ball bonds can be made closer to pads, other bonds, terminals, components, conductors, or other structures with which electrical contact with the wire would be undesirable. Stated differently, ball bonds can be used in a more densely packed configuration. Also, because of the shape of the tools generally used for both types of bonds, the ball bond can be placed closer to a package side wall than a wedge bond. Ball bonding has the further advantage of being less expensive due in part to the fact that less operator time is required because the bonds can be made faster. In ball ball bonding, the operator only manipulates the tool in the X and Y direction; in wedge bonding, the angle of the bond may also be a critical factor to prevent wire contact with other structures.

Ball bonding, however, has had a disadvantage that wedge bonding does not have. That is, while wedge bonding has been performed using both gold and aluminum wires, ball bonding with aluminum has heretofore been impractical. Because of the advantages of ball bonding such as those related to the bond geometry, it has been most important to develop a method of ball bonding aluminum wires. The advantages of using aluminum wires over gold are that aluminum is much less expensive and exhibits the radiation hardening properties that may be required in military semiconductor applications. Also, a monometallic aluminum joint between aluminum pads and the wire is desirable because it eliminates the possibility of brittle intermetallic compounds which result in decreased reliability. In short, the desirability of being able to ball bond aluminum wires has been recognized for some time.

The reason that aluminum wire ball bonding has been impractical is the inability to form the spherical shape or ball on the end of the wire. With a gold wire, heat applied to the end of the wire by such well-known techniques as a hydrogen flame or spark discharge liquifies the end region and a ball forms as the result of the surface tension forces. With aluminum, however, an oxide layer on the wire inhibits the surface tension forces from forming the ball. The oxide layer forms naturally and very rapidly on an exposed surface of aluminum. Accordingly, even if the oxide layer is removed, new oxide rapidly forms to either prevent the formation of the ball or cause an irregular shape if one is formed.

Prior art attempts to develop a method for forming spherical ends on aluminum wires for ball bonding having included various heat sources such as, for example, a focused laser beam, a microplasma torch, plasma discharge, and a miniature radiant heater. Furthermore, heating operations have been carried out in a protective atmosphere such as in an inert gas to prevent the additional formation of oxide. However, it was found that the surface oxide film was sufficient to oppose the native surface surface tension forces and prevent the forming of a spherical end of quality required for ball bonding.

It has been found that better quality aluminum spheres can be formed by positioning the wire in an inert gas such as helium and using an electrode of much lower voltage than commonly used to generate the heat through an electric arc. For example, the arcing electrode for gold wires is typically about 1200 volts. By reducing the voltage of the electrode to about 500 volts, improved sphere formation on aluminum wires results. However, it is well known that the arc voltage must be in excess of the minimum sparking potential in the atmosphere of the spark gap. With the 1200 volt potential commonly used for gold, gaps on the order of 0.005 inches can be ionized and this gap spacing can be readily provided by existing equipment. However to obtain reliable ionization with a 500 volt potential, the acceptable gap has to be in the range from 0.001 to 0.002 inches. With existing equipment, there is a significant problem in obtaining these precise arc gaps. If the gap is too large, there is no ionization and no spark. One prior art method to overcome the small arc gap tolerance problem was to use a contact method of spark initiation. With potential voltages of less than 200 volts, the wire and/or electrode are moved until there is contact. This method, however, introduced new problems related to the precision of moving the small diameter wire in contact with the electrode to strike the arc.

SUMMARY OF THE INVENTION

The invention discloses a method of forming a substantially spherical shape on the end of a wire to be used in ball bonding comprising the steps of forming an arc gap comprising an electrode and the end of the wire, applying a first potential voltage across the gap, the first voltage being less than the minimum sparking potential of the gap, and applying an impulse second potential voltage across the gap, the second voltage being greater than the minimum sparking potential of the gap. It may be preferable that the gap is greater than 0.001 inches. More specifically, it may be preferable that the gap is substantially larger than 0.001 inches and on the order of 0.035 inches so as to reduce consideration of equipment tolerances. Also, it may be preferable that an inert gas such as argon, nitrogen, or helium be in the gap. The first voltage may preferably be less than 300 volts and more preferably may be in the range from 30 to 60 volts. The second voltage is preferably greater than 1000 volts and more preferably on the order of 6000 volts. The wire used and prepared for ball bonding may have a diameter in the range from 25 to 250 microns.

The invention may also be practiced by the method of forming a substantially spherical shape on the end of a wire in preparation for ball bonding the wire to a substantially planar surface, comprising the steps of positioning an electrode and the end of the wire in a spaced relationship separated by a gap of greater than 0.001 inches, supplying a first potential voltage of less than 300 volts between the wire and the electrode and supplying an impulse second potential voltage of greater than 1000 volts between the wire and the electrode to ionize the gap therebetween thereby initiating an electrical arc. It may be preferable that the wire be negative with respect to the electrode after the first and the second voltages are supplied. The first voltage may preferably be 40 volts, the second voltage may preferably be 6000 volts. This method of preparing a wire for ball bonding has been found to be effective for both aluminum and aluminum alloy wires.

The invention also discloses the method of forming a ball on the end of a wire in preparation for ball bonding the wire to a substantially planar surface, comprising the steps of positioning an electrode and the end of the wire in a protective environment, the electrode and the end being separated by a gap greater than 0.001 inches, supplying a potential of less than 300 volts between the wire and the electrode, and supplying an impulse potential of greater than a 1000 volts between the wire and the electrode to ionize the gap therebetween to initiate an electrical arc. The protective environment may preferably be argon, helium or nitrogen.

The invention may be practiced by the combination of means for forming an arc gap comprising an electrode, means for providing a first potential voltage less than the minimum sparking potential of the gap to the gap and means for providing an impulse second voltage potential greater than the minimum sparking potential of the gap to the gap. The forming means may further comprise an aluminum wire positioned in spaced relationship with the electrode forming the gap. It may be preferable that the gap be greater than 0.005 inches. Also, the means for providing the first voltage may comprise a compacitor and a DC power supply. Further, the means for providing the second voltage may comprise a trigger transformer.

The invention discloses an apparatus for forming a spherical shape on the end of a wire in preparation for ball bonding the wire, comprising means for forming a spark gap comprising the end of the wire and an electrode, means for providing a protective environment for the gap, a capacitor having one terminal coupled to the electrode and the other terminal coupled to electrical ground, means coupled to the one terminal for charging the capacitor to a potential of less than 300 volts, and means for providing an impulse potential of greater than 1000 volts to the electrode to ionize the gas in the gap.

BRIEF DESCRIPTION OF THE DRAWINGS

The foregoing and other advantages of the invention will be more fully understood with reference to the description of the preferred embodiment with reference to the drawings wherein.

DESCRIPTION OF THE PREFERRED EMBODIMENT

Figure 1:
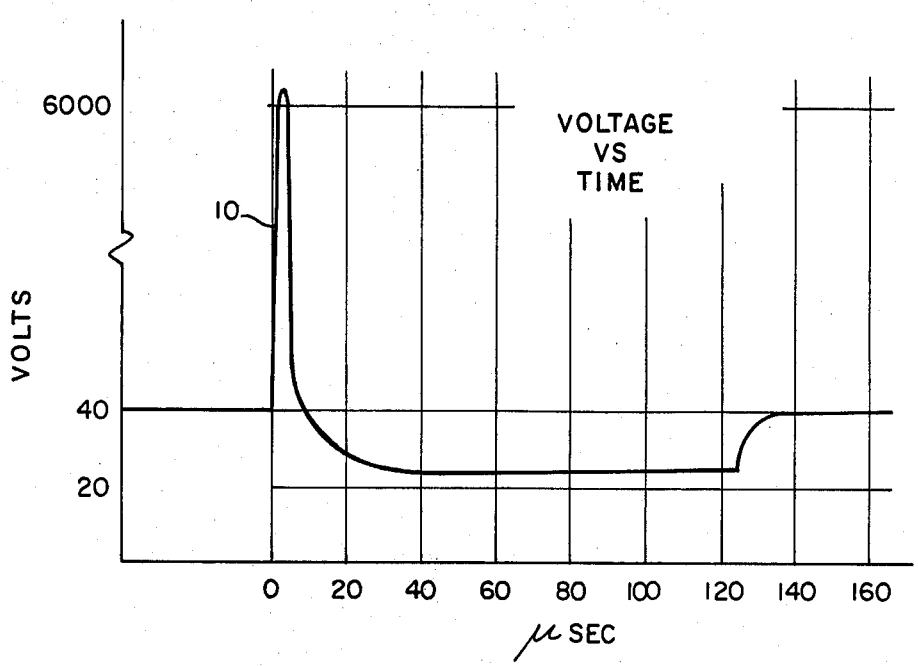
FIG. 1 is a voltage versus time plot across the electrode of an apparatus embodying the invention which is used to prepare wires for ball bonding.

Referring to FIG. 1, there is shown a voltage versus time plot of the potential across the arc gap of an aluminum ball bonding apparatus embodying the invention. The purpose of the potential is to provide an electric arc between an electrode and the end of an aluminum wire so that the end will liquify and form a sphere as a result of surface tension forces. The wire with the spherical end can then be used in ball bonding as will be described later herein.

The invention has advantage with wire alloys and metals other than aluminum but the motivation for the invention resulted from a problem most often associated with aluminum. Specifically, that problem was the inability to form high quality spheres on the ends of aluminum wires because the oxide layer inhibits surface tension forces. It is well known that the oxide layer forms on exposed aluminum very rapidly. It was found that arc voltage potentials substantially less than typically used with gold wires produced higher quality spheres on aluminum wires. While voltage potentials of approximately 1200 volts are commonly used with gold wires, an initial potential of 40 volts is shown in FIG. 1. It has been found that it is preferable that the wire voltage be negative with respect to the arc electrode but the invention can be practiced with the polarity reversed.

It may be preferable that the wire be positioned in a protective environment such as an inert gas to prevent or reduce the formation of additional oxide during the arcing process. Examples of gases used for the protective environment are argon, helium, and nitrogen. The invention has also been practiced with good success in air. Conventional inert gas chambers can be used if the arcing is to be performed in an inert gas.

It is well known that in most environments including those described above, the initial voltage of 40 volts as shown in FIG. 1 is not sufficient to cause ionization and a spark to jump unless the arc gap is substantially less than 0.001 inches. Furthermore, as described in the background, it is preferable that the gap spacing be substantially larger than 0.001 inches so as to simplify the equipment used to position the gap members.

In accordance with the invention, an auxillary ionization means is used so that an arc voltage in the range of 30 to 60 volts can be used. A high voltage ionization impulse 10 is superimposed on the electrode. Impulse 10 which may be on the order of 6000 volts with a timed duration of a few microseconds is of sufficient magnitude to ionize the gas in the gap thereby breaking down the gap and permitting a low voltage arc to be initiated. In short, a voltage of less than the minimum sparking potential for the particular gap is held across the gap and then an impulse voltage greater then the minimum sparking potential is superimposed thereon.

Figure 2:
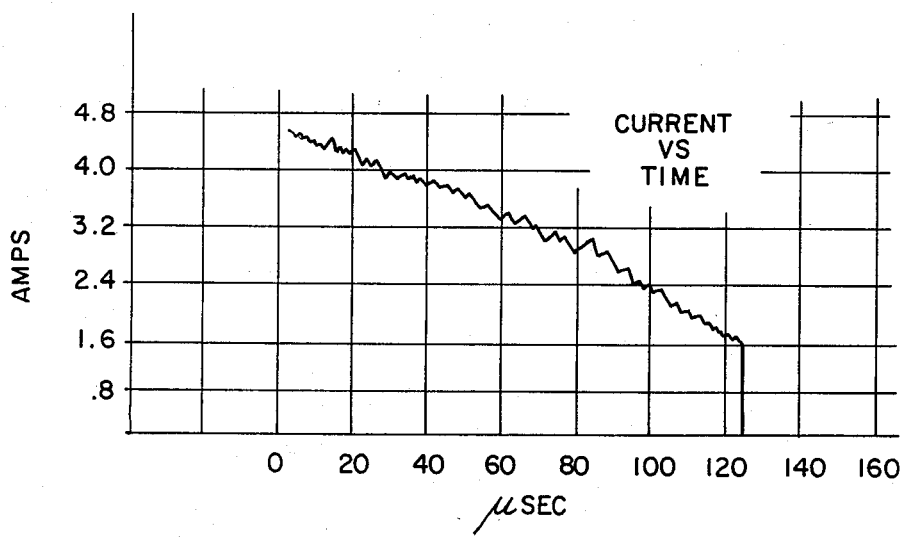
FIG. 2 is the current versus time plot across the gap referred to above.

Referring to FIG. 2, the current flowing across the arc is shown. Initally, when impulse 10 breaks down the gap a maximum amount of current flows. For example, as shown in FIG. 2, which is plotted from actual data using a 0.035 inch gap, approximately 4.8 amps flowed when the arc was initiated. When the high voltage of impulse 10 is no longer present, the low voltage is sufficient to continue the arc as shown in FIG. 2. The voltage potential as shown in FIG. 1 may be partially stored in a capacitor causing discharge and a reduction in voltage below the initial value. For the conditions given herein the reduction was to a value of approximately 25 volts. The current flowing continued to reduce until there was not sufficient ionization to maintain the arc at which time current ceased to flow. As shown in FIG. 2, the arc may be maintained for a period of 100 microseconds or longer. Once the arc ceases, the capacitor in the circuit recharges to its initial value of approximately 40 volts.

It will be understood by those skilled in the art that the parameters of voltage and gap width described herein can be varied thus producing different currents and time periods for arcs. Furthermore, the selection of the gas environment will effect the operation of the invention. Also, the geometry of the electrode and size and type of wire will have an impact on the arc. What is important to note is that the use of an impulse permits the arc voltage to be substantially lowered from those typically used and that the lowered voltage significantly improves the quality of the spheres formed on the ends of wires. Specifically, spheres having symmetry about the wires are formed. Furthermore, the use of the ionizing impulse voltage on the order of several thousand volts permits the use of relatively large arc gaps which substantially reduce consideration towards equipment tolerances. Described herein, therefore is a method and apparatus for mass producing spherical ends on aluminum wires without regard to close tolerances for arc gaps or wire electrode contacts.

Figure 3:
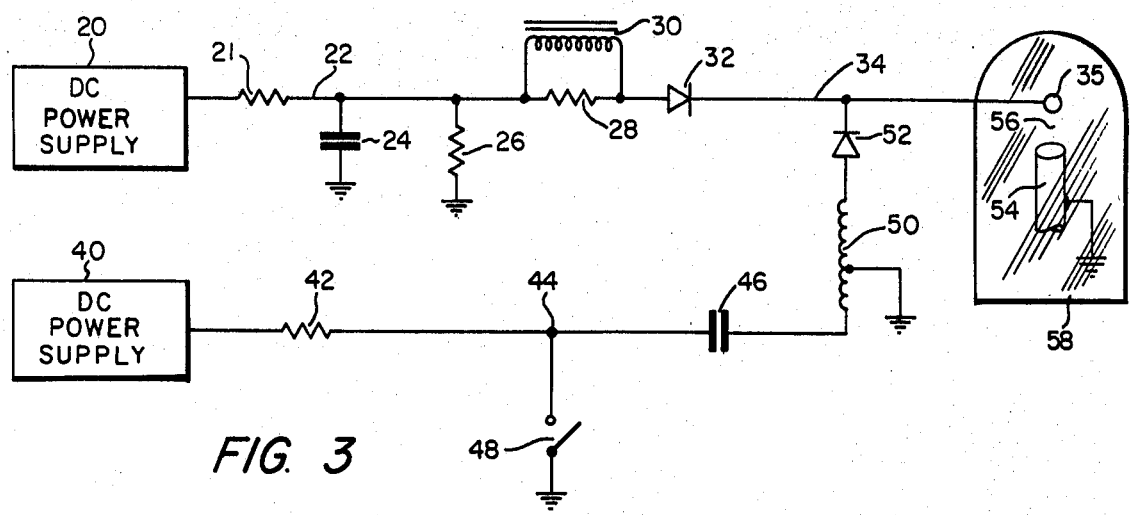
FIG. 3 is a hardware implementation of an apparatus embodying the invention.

Referring to FIG. 3, a hardware implementation for providing the voltage waveform of FIG. 1, is shown. DC power supply 20 is a conventional power supply which provides an adjustable output voltage preferably in the range from 30 to 60 volts on line 22 through series charging resistor 21. Capacitor 24 is charged to the voltage on line 22. Resistor 26 provides a path to ground to discharge capacitor 24 when DC power supply 20 is turned off. The combination of resistor 28 and inductor 30 provides pulse shaping according to well known principles. Diode 32 prevents flow of current from line 34 back towards the components described heretofore. Line 34 is connected to the electrode 35 of the spark gap. The circuit described heretofore provides the adjusted 40 volts shown in FIG. 1.

Still referring to FIG. 3, DC power supply 40 provides a voltage potential through series charging resistor 42 to charge capacitor 46 to a voltage of, for example, +85 volts. According to well know principles, when switch 48 is closed forcing junction 44 and the positively charged side of capacitor 46 to ground, a negative impulse is induced on the opposite side of capacitor 46. The negative impulse which may be approximately −85 volts is inverted and stepped to a much higher voltage by trigger transformer 50 having a tap connected to ground in conventional manner. The output of trigger transformer 50 onto line 34 is the approximately 6000 volt impulse shown in FIG. 1. Diode 52 prevents current from flowing from line 34 back towards trigger transformer 50. Examples of the circuit components heretofore described are listed in an Appendix herein.

Line 34 is connected to electrode 35 which is in spaced relationship with wire 54 to provide arc gap 56. As described earlier herein, with the impulse voltage of several thousand volts to ionize gap 56, gap spacings in excess of 0.01 inches may be used; these gaps are substantially larger than provided in the prior art. Wire 54 may be an aluminum wire having a diameter in the range from 25 to 250 microns. Preferably, wire 54 is grounded. Conventional gas chamber 58 provides a protective environment of an inert gas such as argon, helium, or nitrogen to eliminate the formation of additional oxide on wire 54.

In operation, capacitor 24 is charged to a voltage in the range from 30 to 60 volts determined by the adjustment of DC power supply 20. When impulse 10 ionizes gap 56 initiating the electric arc, capacitor 24 discharges through the arc resulting in a substantial temperature rise at the end of wire 54. A temperature on the order of 2500° C. may be predicted. After capacitors 24 and 46 discharge, they are recharged by the respective DC power supplies before the next electrical arc is initiated.

In a different mode, the invention may be practiced by using a silicon controlled rectifier to function as switch 48. In this embodiment, it may be preferable to provide conventional digital circuits for control and to prevent contact bounce of the switch function.

Figure 4A:
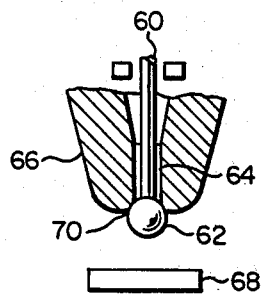
FIGS. 4a-f show a wire bonding sequence.
Figure 4B:
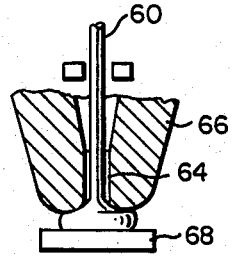
Figure 4C:
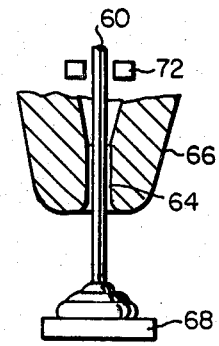
Figure 4D:
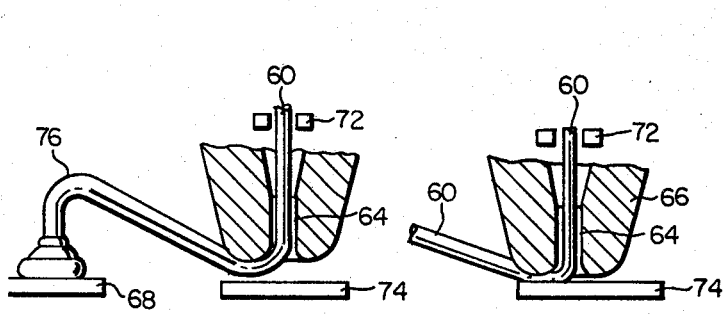
Figure 4E:
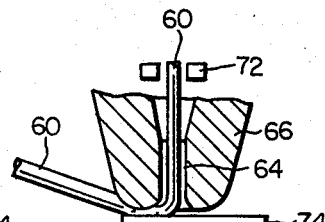
Figure 4F:
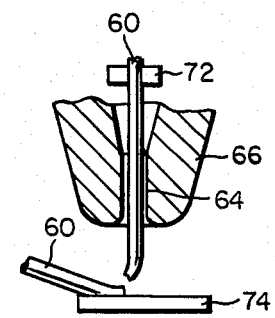

Once the spherical shape is formed on the end of the aluminum wire, the wire may be ball bonded to a planar surface using well known technology. For example, FIGS. 4a–f show a sequence of performing a ball bond and a wedge bond. In FIG. 4a, the wire 60 having a spherical shape 62 on one end is shown positioned in the capillary 64 of a conventional ball bonding device 66. In operation, the operator targets the capillary of the ball bonding device in the X and Y plane over the pad 68 which has heretofore been referred to as the planar surface. The pad may be, for example, a terminal of a silicon chip integrated circuit or the conductor of a circuit of the package. The spherical shape or ball 62 is in contact with the face 70 of the capillary. In further operation as shown in FIG. 4b, the capillary descends bringing the ball in contact with the pad. In a thermosonic system, the ultrasonic vibration is applied at this stage. After the ball 62 is bonded to the pad, the ball bonding device 66 is raised to the loop height position as shown in FIG. 4c. In the raising operation, the clamps 72 are open and the wire 60 is free to feed out of the end of capillary 64. As described earlier herein, the takeoff angle of wire 60 is perpendicular to the planar surface of pad 68. As shown in FIG. 4d, the ball bonding device 66 is positioned over lead or conductor 74 to which electrical contact with pad 68 is to be made. The wire 60 is fed out of the end of the capillary forming a loop 76. An advantage of ball bonding over wedge bonding which is apparent from FIG. 4d is that the wire 60 can be fed in any direction from the ball bond joint. In FIG. 4e, it is shown that the ball bonding device deforms wire 60 against the conductor 74. The shape of device 66 produces a wedge shaped bond which has a gradual transistion into the wire. In a thermosonic system, the ultrasonic vibration is applied at this stage. In FIG. 4f the ball bonding device is raised off the conductor and at some pre-set height, clamps 72 are closed while the device is still rising. When the clamps 72 are closed, stress is put onto wire 60 and it breaks at the thinnest cross-section of the bond. It is noted that FIGS. 4a-f illustrate the operation of ball bonding in one application. Many other procedures and techniques can be used to take advantage of the aluminum wire having a spherical end. After the final stage as shown in FIG. 4f, wire 60 extends from the ball bonding device 66. At this stage, a spherical shape can be formed on the end of the extending wire in accordance with the invention as defined herein. Furthermore, the entire apparatus can be positioned within a protective environment such as an inert gas.

To one skilled in the art, the reading of this disclosure will bring to mind many modifications and alterations without departing from the spirit and scope of the invention. Accordingly, it is intended that the scope of the invention be limited only be the appended claims.

| Reference No. | Appendix Description |
|---|---|
| 21 | resistor 1k ¼w |
| 24 | capacitor 25 uf 200v |
| 26 | resistor 100k ¼w |
| 28 | resistor 1ohm 1w |
| 30 | inductor 1000 mh |
| 32 | diode Unitrode USR60 |
| 42 | resistor 100k ¼w |
| 46 | capacitor .25uf 200v |
| 50 | trigger transformer UTC PF7 |
| 52 | diode Unitrode USR60 |

What is claimed is:

1. The method of forming a substantially spherical shape on the end of an aluminum wire in preparation for ball bonding said wire to a substantially planar surface, comprising the steps of:
    positioning an electrode, said wire and said substantially planar surface in a protective environment of an inert gas;
    providing an arc gap between said electrode and said end of said wire;
    applying a first potential voltage from a direct current source across said gap, said first voltage being less than the minimum sparking potential of said gap; and
    applying an impulse second potential voltage across said gap, said second voltage being greater than the minimum sparking potential of said gap to provide a spark across said gap, said spark initiating an arc of current from said source across said gap, said arc continuing after said impulse for a period of time less than 200 microseconds until said current decays to a level insufficient to sustain said arc.

2. The method in accordance with claim 1 wherein said gap is greater than 0.001 inches.

3. The method in accordance with claim 1 wherein said first voltage is less than 300 volts.

4. The method in accordance with claim 1 wherein said second voltage is greater than 1000 volts.

5. The method in accordance with claim 1 wherein said wire has a diameter in the range from 25 to 250 microns.

6. The method of bonding the end of an aluminum wire to a substantially planar metal surface, comprising the steps of:
    positioning an electrode, said wire and said substantially planar surface in a protective environment of an inert gas;
    positioning said electrode and said end of said wire in a spaced relationship separated by a gap of greater than 0.001 inches;
    supplying a first potential voltage from a direct current source across said gap, said first voltage being less than 300 volts;
    supplying an impulse second potential voltage of greater than 1000 volts between said wire and said electrode to ionize said gap, said ionization initiating an electrical arc of current from said source across said gap, said arc continuing for a time period of less than 200 microseconds after said impulse until said current decays to a level insufficient to sustain said arc, said electrical arc forming a spherical shape on said end of said wire; and
    ball bonding said spherical shape to said substantially planar surface.

7. The method in accordance with claim 6 wherein said wire is negative with respect to said electrode after said first voltage is supplied.

8. The method in accordance with claim 8 wherein said wire is negative with respect to said electrode after said second voltage is supplied.

9. The method in accordance with claim 6 wherein said first voltage is approximately 40 volts.

10. The method in accordance with claim 6 wherein said second voltage is approximately 6000 volts.

11. The method recited in claim 6 wherein said impulse is supplied by a trigger transformer.

12. Apparatus for forming a spherical shape on the end of an aluminum wire in preparation for ball bonding the wire, comprising an electrode spaced from said wire defining an arc gap therebetween;
    a direct current source for providing a first potential voltage less than the minimum sparking potential of said gap to said electrode; and
    means for providing an impulse second voltage potential greater than the minimum sparking potential of said gap to said gap, said second voltage providing a spark to ionize said gap wherein an arc of current from said source across said gap is initiated, said arc continuing after said impulse for a period of time less than 200 microseconds until said current decays to a level insufficient to sustain said arc.

13. The apparatus recited in claim 12 wherein said gap is greater than 0.005 inches.

14. The apparatus recited in claim 12 wherein said direct current source comprises a capacitor and a DC power supply.

15. The apparatus recited in claim 12 wherein said means for providing said second voltage comprises a trigger transformer.

16. An apparatus for forming a spherical shape on the end of an aluminum wire in preparation for ball bonding the wire, comprising:
    an electrode spaced from said wire defining an arc gap therebetween;
    means for providing a protective environment for said gap;
    a first capacitor having one terminal coupled to said electrode and the other terminal coupled to electrical ground;
    a source of direct current potential of les than 300 volts coupled to said one terminal for charging said first capacitor; and means for providing an impulse potential of greater than 1000 volts to said electrode to ionize the gas in said gap, said providing means comprising a series from a direct current power supply through a resistor, a second capacitor and a trigger transformer to said electrode, the connection between said resistor and said second capacitor including a switch to ground, said impulse potential being initiated by closing said switch, said impulse potential providing a spark to initiate an arc of current flow from said first capacitor across said gap, said arc continuing after said impulse for a period of time less than 200 microseconds until said current decays to a level insufficient to sustain said arc.

17. The apparatus of claim 6 wherein said protective environment comprises an inert gas.

18. The apparatus recited in claim 17 wherein said inert gas is helium.

19. The apparatus recited in claim 17 wherein said inert gas is nitrogen.

20. The apparatus recited in claim 6 wherein said inert gas is argon.

21. The apparatus recited in claim 16 further comprising a diode between said trigger transformer and said electrode.

22. The apparatus recited in claim 16 further comprising a diode between said first capacitor and said electrode.